US006912703B2

United States Patent
Wang et al.

(10) Patent No.: US 6,912,703 B2
(45) Date of Patent: Jun. 28, 2005

(54) STRUCTURE OF INTEGRATED CIRCUIT STANDARD CELL LIBRARY FOR REDUCING POWER SUPPLY VOLTAGE FLUCTUATION

(75) Inventors: Shao-Yu Wang, Hsin-Chu (TW); Chien-Te Wu, Hsin-Chu (TW); Jun-Jyeh Hsiao, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 166 days.

(21) Appl. No.: 09/809,830

(22) Filed: Mar. 19, 2001

(65) Prior Publication Data

US 2004/0168141 A1 Aug. 26, 2004

(51) Int. Cl.[7] .............................................. G06F 17/50
(52) U.S. Cl. ................... 716/8; 716/7; 716/10; 716/17
(58) Field of Search ................... 716/7–15, 17

(56) References Cited

U.S. PATENT DOCUMENTS

| 4,811,237 A | 3/1989 | Putatunda et al. ........... 364/491 |
| 5,391,900 A | 2/1995 | Onodera et al. ............. 257/207 |
| 5,442,206 A | 8/1995 | Ienaga et al. ................ 257/207 |
| 5,537,328 A | 7/1996 | Ito .............................. 364/489 |
| 5,726,904 A | 3/1998 | Lin et al. ..................... 364/491 |
| 6,091,090 A | 7/2000 | Gheewala .................... 257/211 |
| 6,594,813 B1 * | 7/2003 | Gandhi et al. ................ 716/17 |

* cited by examiner

*Primary Examiner*—Vuthe Siek
*Assistant Examiner*—Paul Dinh

(57) ABSTRACT

A layout structure and method are described for the layout of chips having libraries of standard cells which minimizes voltage fluctuations on power buses caused by switching circuits in the standard cells. Typically these standard cells are arranged in a row between two power buses. In this invention the standard cells are partitioned into first cells and second cells which can be combined to form the standard cell circuit. The first cells are arranged in a first row and the second cells are arranged in a second row. A first power bus is located above the first row of first cells and a second power bus is located below the second row of second cells. The first power bus and second power bus are electrically connected together. The first power bus supplies a first power supply voltage to the first cells and the second power bus supplies the first power supply voltage to the second cells. A third power bus is located between the first row of first cells and second row of second cells and supplies a second power supply voltage to the first and second cells. The layout can be accomplished automatically using a computer program.

27 Claims, 4 Drawing Sheets

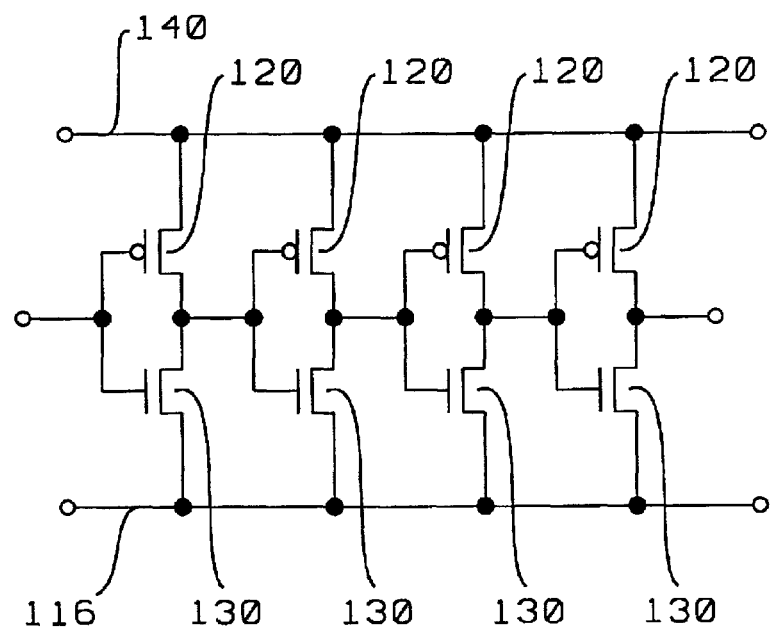
*FIG. 1 - Prior Art*
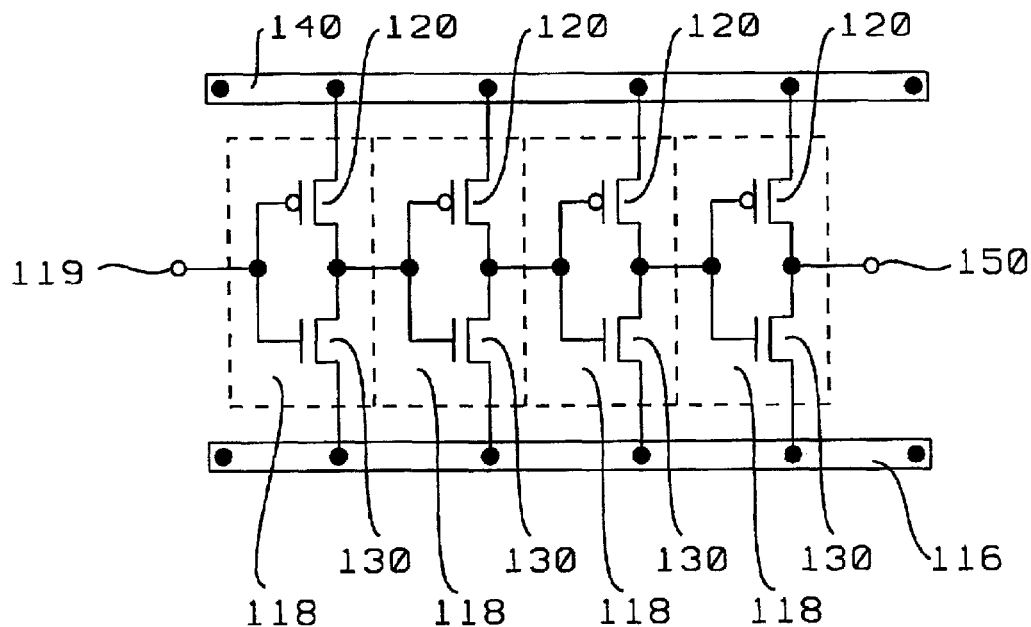
*FIG. 2 - Prior Art*

STRUCTURE OF INTEGRATED CIRCUIT STANDARD CELL LIBRARY FOR REDUCING POWER SUPPLY VOLTAGE FLUCTUATION

BACKGROUND OF THE INVENTION (1) Field of the Invention

This invention relates to a layout structure for standard cell or library circuit cells which reduce fluctuations in power supply voltage supplied to the cells due to large current swings.

(2) Description of the Related Art

Power and ground voltages are typically supplied to integrated circuit devices by power buses. Frequently the current fluctuations in these buses, caused by circuit switching, cause fluctuations in the voltage actually delivered to the devices. A number of workers have described methods to minimize the fluctuations in the power supply voltage actually delivered to these devices due to current fluctuations in the power supply buses.

U.S. Pat. No. 4,811,237 to Putatunda et al. describe an integrated circuit chip layout arrangement using an interlocking power bus mesh structure.

U.S. Pat. No. 5,391,900 to Onodera et al. describe an integrated circuit chip design having at least one power supply point for supplying electrical power and at least one first, second, and third power trunk line.

U.S. Pat. No. 5,442,206 to Ienaga et al. describes a layout structure of power source potential lines and grand potential lines for integrated circuits which avoids short circuit of lines, uses automated layout design, and avoids the need for manual modification of power source lines.

U.S. Pat. No. 5,537,328 to Ito describes a method of laying out power supply wiring conductors in integrated circuits.

U.S. Pat. No. 5,726,904 to Lin et al. describes power buses having power slits and a method of forming these power buses.

U.S. Pat. No. 6,091,090 to Gheewala describes a layout structure for routing local and global interconnections for a gate array integrated circuit wherein basic cells are arranged as an array having rows and columns.

SUMMARY OF THE INVENTION

Core cells, such as standard cells or gate array cells, are frequently used in the design of integrated circuit chips. These cells are frequently arranged in rows on an integrated circuit chip with power supplied by power rails, or power buses, at the top and bottom of the rows. An example of this layout arrangement is shown in FIGS. 1 and 2. FIG. 1 shows a schematic view number of inverter circuits, in this example four, each inverter circuit comprising a P channel FET 120, field effect transistor, and an N channel FET. The cells are supplied by a $V_{DD}$ power supply bus 140 at the top of the row of cells connected to the source of the P channel FETs 120 and a $V_{SS}$ supply bus 116 at the bottom of the row of cells connected to the source of the N channel FETs 130.

FIG. 2 shows a diagram of the physical layout of the cells 118 on an integrated circuit chip. The boundaries of each cell 118 are indicated by a dashed line around each cell. Each cell 118 contains a P channel FET 120 and an N channel FET 130. The supply end 110 of the $V_{DD}$ supply bus 140 is at the left hand side of the supply bus 140. Current fluctuations in the cells due to switching voltages applied to the signal input 119 of the cells will cause undesirable voltage fluctuations to occur on the $V_{DD}$ supply bus, due to resistance voltage drops on the $V_{DD}$ supply bus, which will cause undesirable voltage fluctuations at the output terminal 150 of the row of cells.

It is a principal objective of this invention to provide a layout structure for standard cells or library cells which will minimize voltage fluctuations on the power supply bus due to resistance voltage drops.

It is another principal objective of this invention to provide method for layout of standard cells or library cells which will minimize voltage fluctuations on the power supply bus due to resistance voltage drops.

It is another principal objective of this invention to provide a computer program for a method for layout of standard cells or library cells which will minimize voltage fluctuations on the power supply bus due to resistance voltage drops.

These objectives are achieved by partitioning each of the standard cells into a first cell and a second cell. The first cells are arranged in a first row. The second cells are arranged in a second row directly below the first row of first cells. A first power bus is arranged in a straight line over the top of the first row of first cells. A second bus, carrying the same supply voltage as the first bus is arranged in a straight line, parallel to the first power bus, below the second row of second cells. In this layout the first row of first cells and the second row of second cells are between the first power bus and the second power bus.

A third power bus, carrying a supply voltage different from that carried by the first power bus and the second power bus, is arranged in a straight line, parallel to the first power bus, and between the first row of first cells and the second row of second row of second cells. Electrical connections are made from the first power bus to appropriate points in the first row of first cells, from the second power bus to appropriate points in the second row of second cells, and from the third power bus to appropriate points in both the first row of first cells and the second row of second cells. Electrical connections are made between the first row of first cells and the second row of second cells so that one of the first cells and one of the second cells make one of the standard cells of the library. One end of the first power bus is electrically connected to the end of the second power bus directly below. The other end of the first power bus is electrically connected to the end of the second power bus directly below.

In this manner the current supplied by the power supply connected to the first and second power buses is shared between the first power bus and the second power bus and resistance voltage drop problems on the first power bus and second power bus are minimized.

BRIEF DESCRIPTION OF THE DRAWINGS

FIG. 1 shows a schematic drawing of a conventional library of standard cells.

FIG. 2 shows a diagram of the chip layout for a conventional library of standard cells.

DESCRIPTION OF THE PREFERRED EMBODIMENTS

Figure 3:
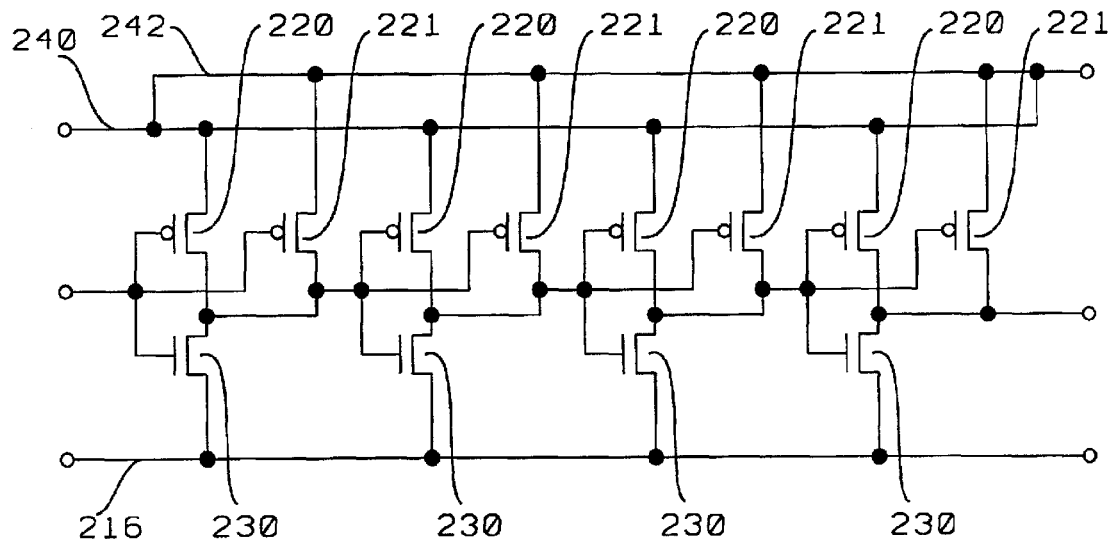
FIG. 3 shows a schematic drawing of the modified standard cells of FIG. 1 for the layout structure of this invention.
Figure 4:
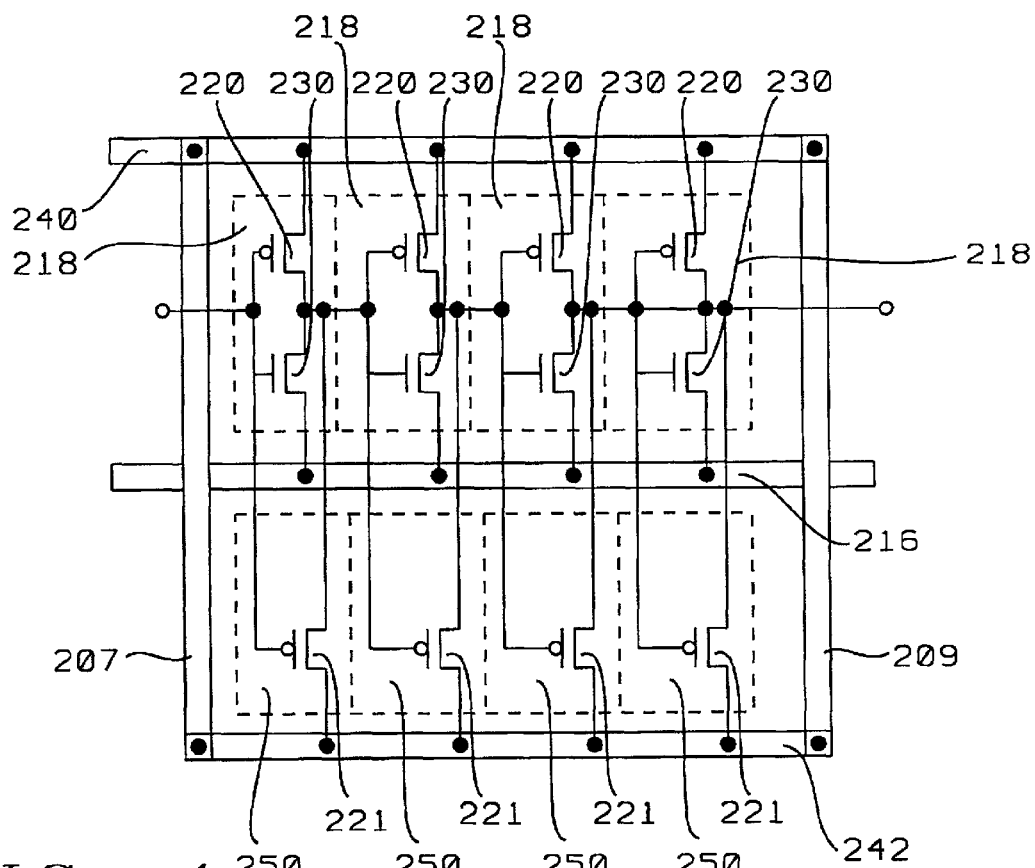
FIG. 4 shows a diagram of the modified chip layout, for the library of standard cells shown in FIG. 1, for the layout structure of this invention.
Figure 5:
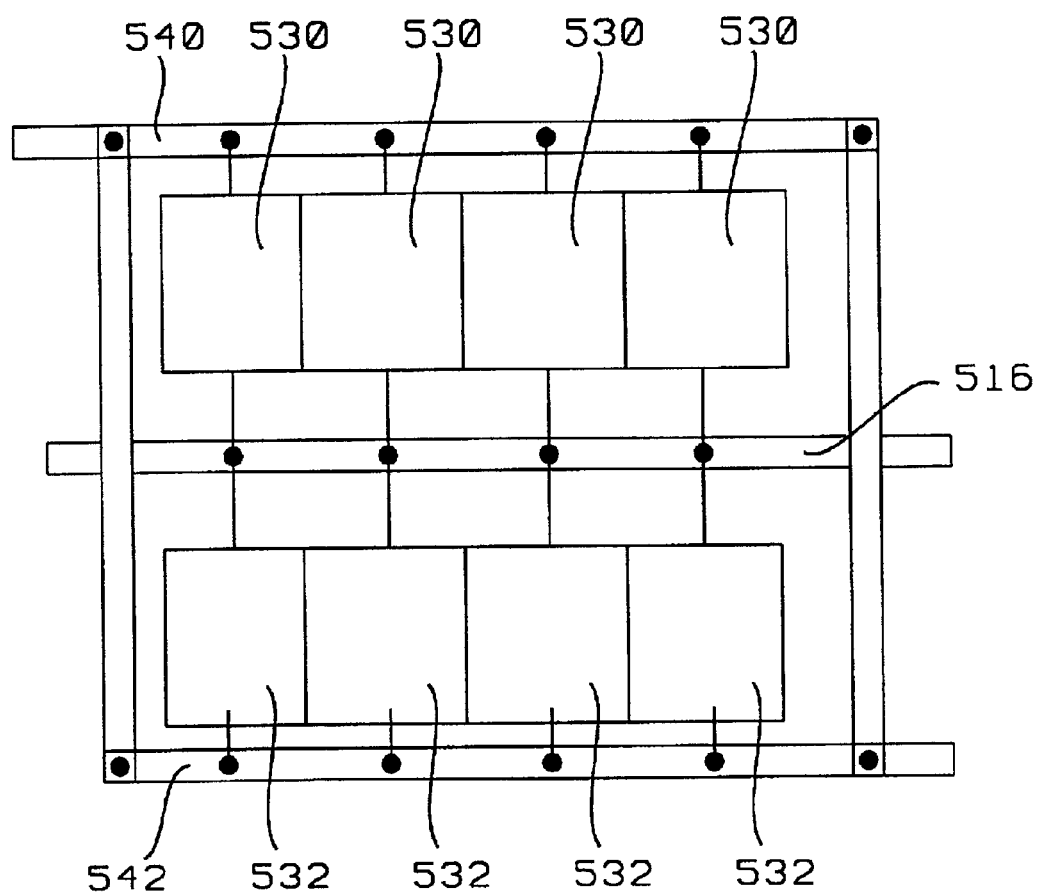
FIG. 5 shows a diagram of a chip layout for the layout structure of this invention.

Refer now to FIGS. 3–5 for the layout structure this invention. FIG. 3 shows a schematic diagram of the circuit resulting from partitioning the circuit of FIG. 1 according to the layout structure and method of this invention. Each of the P channel FETs 120 shown in FIG. 1 are replaced by a parallel combination of a first P channel FET 220 and a second P channel FET 221, as shown in FIG. 3. Each of the N channel FETs 130 shown in FIG. 1 are remain as a single N channel FET 230 as shown in FIG. 3. The single $V_{DD}$ power supply bus 140 shown in FIG. 1 is replaced by a first power bus 240 and a second power bus 242 as shown in FIG. 3. As shown in FIG. 3 the sources of the first P channel FETs 220 are connected to the first power bus 240 and the sources of the second P channel FETs 221 are connected to the second power bus 242. Also as shown in FIG. 3, the sources of the N channel FETs 230 are connected to a second power bus 216. The first power bus 240 and second power bus 242 are electrically connected together at both ends of the row of cells and distribute the voltage from the $V_{DD}$ power supply to the sources of the first P channel FETs 220 and second P channel FETs 221. The third power bus 216 distributes the voltage from the $V_{SS}$ power supply to the sources of the N channel FETs 230.

FIG. 4 shows the chip layout structure for the circuit shown in FIG. 3. The first power bus 240, second power bus 242, and third power bus 216 are laid out as three parallel buses with the first power bus 240 at the top, the second power bus 242 at the bottom, and the third power bus 216 between the first power bus 240 and the second power bus 242.

A number of first cells 218 are formed each having a first P channel FET 220 and an N channel FET 230. The boundaries of the first cells 218 are shown as dashed lines in FIG. 4. The first cells are arranged in a first row located between the first power bus 240 and the third power bus 216 with the sources of the first P channel FETs 220 connected to the first power bus 240 and the sources of the N channel FETs 230 connected to the third power bus 216. A number of second cells 250 are formed each having a second P channel FET 221. The boundaries of the second cells 250 are shown as dashed lines in FIG. 4. The second cells are arranged in a second row located between the third power bus 216 and the second power bus 242 with the sources of the second P channel FETs 221 connected to the second power bus 242.

An electrical connection 207 interconnects the first power bus 240 and the second power bus 242 at the left end of the first row of first cells 218 and second row of second cells 250. Another electrical connection 209 interconnects the first power bus 240 and the second power bus 242 at the right end of the first row of first cells 218 and second row of second cells 250.

The layout structure shown in FIG. 3 and 4 provides circuits which have the same function as the circuits shown in FIGS. 1 and 2 with reduced currents in the first power bus 240 and second power bus 242 so that the voltage on the first power bus 240 and second power bus 242 will have greatly reduced voltage fluctuations due to switching current levels and resistance voltage drops.

FIGS. 3 and 4 show a row of inverter circuits as an example of the layout structure of this invention. As shown in FIG. 5 other standard cell circuits can be laid out in this manner. FIG. 5 shows a first row of first cells 530 and a second row of second cells 532. The first cells 530 and second cells 532 are such that they can be combined to provide the function of standard cells. As shown in FIG. 5 a first power bus 540, second power bus 542, and third power bus 516 are arranged as parallel electrodes on the chip with the first power bus 540 on the top, the second power bus 542 on the bottom, and the third power bus 516 between the first power bus 540 and the second power bus 542. The first power bus 540 and second power bus 542 are electrically connected together as shown in FIG. 5. The first power bus 540 supplies a first power supply voltage, such as $V_{DD}$, to the first row of first cells 530 and the second power bus 542 supplies the first power supply voltage to the second row of second cells 532. The third power bus supplies a second power supply voltage, such as $V_{SS}$, to the first row of first cells 530 and the second row of second cells 532.

Figure 6:
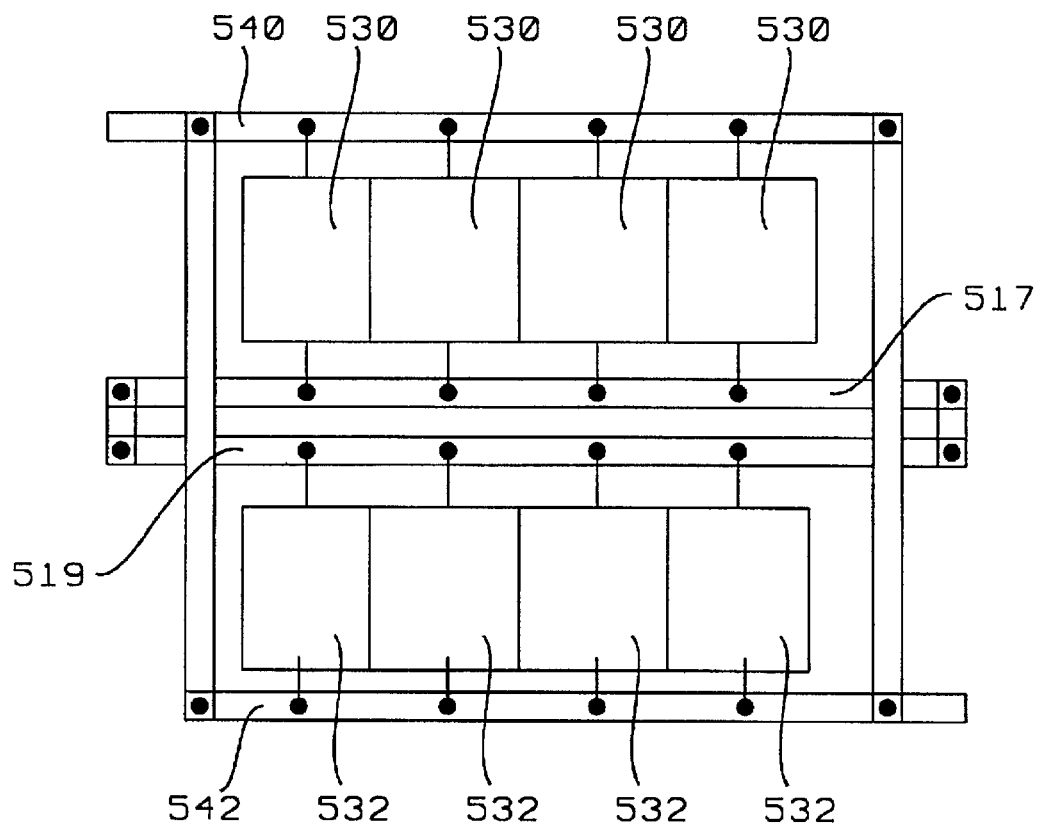
FIG. 6 shows a diagram of another chip layout for the layout structure of this invention.

As shown in FIG. 6 the third power bus shown in FIG. 5 could be split into a fourth power bus 517 and a fifth power bus 519. In the layout structure of FIG. 6 the power supply voltage distributed by the third power bus 516, see FIG. 5, is distributed to the first row of first cells 530 by the fourth power bus 517 and to the second row of second cells by the fifth power bus 519. As shown in FIG. 6 the fourth power bus 517 and fifth power bus 519 are electrically connected at both the right end of the array and the left end of the array.

Figure 7:
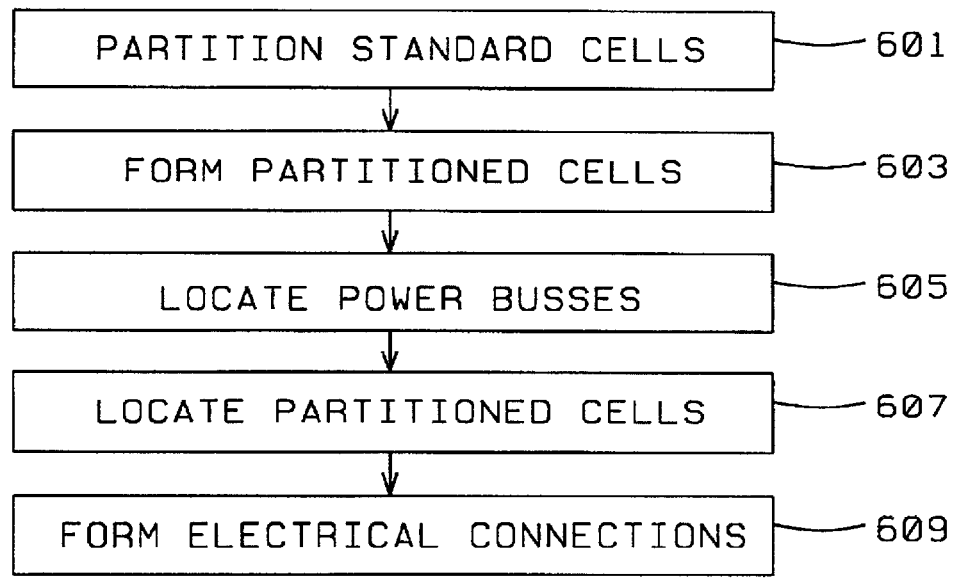
FIG. 7 shows a flow diagram for the layout method and computer program for the layout method of this invention.

FIG. 7 shows a flow diagram of the method of this invention. The standard cells are first partitioned 601 into first cells and second cells 603. The power buses are located 605 with a first power bus at the top, a second power bus at the bottom, and a third power bus between the first power bus and the second power bus. The partitioned cells are located 607 with a first row of first cells located between the first power bus and the third power bus and a second row of second cells between the third power bus and the second power bus. The appropriate electrical connections are then formed 609 with the first power pus and second power bus connected together, the first power bus distributing a first power supply voltage to the first row of first cells, the second power bus distributing the first power supply voltage to the second row of second cells, and the third power supply bus distributing a second power supply voltage to the first row of first cells and the second row of second cells. Appropriate electrical connections between the first cells and second cells are also made. A computer program could be used to carry out the layout automatically.

While the invention has been particularly shown and described with reference to the preferred embodiments thereof, it will be understood by those skilled in the art that various changes in form and details may be made without departing from the spirit and scope of the invention.

What is claimed is:

1. A layout structure for integrated circuit standard circuit cells; comprising:

a first power bus, wherein said first power bus is arranged in a straight line;

a second power bus, wherein said second power bus is arranged in a straight line parallel to said first power bus, and electrically connected to said first power bus;

a third power bus, wherein said third power bus is arranged in a straight line parallel to said first power bus and located between said first power bus and said second power bus;

a plurality of first cells arranged in a first row and located between said first power bus and said third power bus, wherein said first cells are coupled to said first power bus and said third power bus; and a plurality of second cells arranged in a second row and located between said second power bus and said third power bus, wherein said second cells are electrically coupled to said first cells, said second power bus, and said third power bus, wherein one of said first cells and one of said second cells combine to form a standard cell.

2. The layout structure of claim 1 wherein said first power bus and said second power bus distribute a $V_{DD}$ supply voltage.

3. The layout structure of claim 1 wherein said third power bus distributes a $V_{SS}$ supply voltage.

4. The layout structure of claim 1 wherein said first cells comprise one or more first semiconductor devices.

5. The layout structure of claim 4 wherein said first semiconductor devices are N channel field effect transistors, P channel field effect transistors, or both N channel field effect transistors and P channel field effect transistors.

6. The layout structure of claim 1 wherein said second cells comprise one or more second semiconductor devices.

7. The layout structure of claim 6 wherein said second semiconductor devices are N channel field effect transistors, P channel field effect transistors, or both N channel field effect transistors and P channel field effect transistors.

8. The layout structure of claim 1 wherein said third power bus is split into two adjacent, parallel, and electrically interconnected power buses.

9. A method of laying out integrated circuit standard circuit cells; comprising:

forming a first power bus, wherein said first power bus is arranged in a straight line;

forming a second power bus, wherein said second power bus is arranged in a straight line parallel to said first power bus, and electrically connected to said first power bus;

forming a third power bus, wherein said third power bus is arranged in a straight line parallel to said first power bus and located between said first power bus and said second power bus;

forming a plurality of first cells arranged in a first row and located between said first power bus and said third power bus, wherein said first cells are coupled to said first power bus and said third power bus; and forming a plurality of second cells arranged in a second row and located between said second power bus and said third power bus, wherein said second cells are electrically coupled to said first cells, said second power bus, and said third power bus.

wherein one of said first cells and one of said second cells combine to form a standard cell.

10. The method of claim 9 wherein said first power bus and said second power bus distribute a $V_{DD}$ supply voltage.

11. The method of claim 9 wherein said third power bus distributes a $V_{SS}$ supply voltage.

12. The method of claim 9 wherein said first cells comprise one or more first semiconductor devices.

13. The method of claim 12 wherein said first semiconductor devices are N channel field effect transistors, P channel field effect transistors, or both N channel field effect transistors and P channel field effect transistors.

14. The method of claim 9 wherein said second cells comprise one or more second semiconductor devices.

15. The method of claim 14 wherein said second semiconductor devices are N channel field effect transistors, P channel field effect transistors, or both N channel field effect transistors and P channel field effect transistors.

16. The method of claim 9 wherein said third power bus is split into two adjacent, parallel, and electrically interconnected power buses.

17. A computer program for laying out integrated circuit standard circuit cells; comprising the steps of:

forming a first power bus, wherein said first power bus is arranged in a straight line;

forming a second power bus, wherein said second power bus is arranged in a straight line parallel to said first power bus, and electrically connected to said first power bus;

forming a third power bus, wherein said third power bus is arranged in a straight line parallel to said first power bus and located between said first power bus and said second power bus;

forming a plurality of first cells arranged in a first row and located between said first power bus and said third power bus, wherein said first cells are coupled to said first power bus and said third power bus; and forming a plurality of second cells arranged in a second row and located between said second power bus and said third power bus, wherein said second cells are electrically coupled to said first cells, said second power bus, and said third power bus.

wherein one of said first cells and one of said second cells combine to form a standard cell.

18. The computer program of claim 17 wherein said first power bus and said second power bus distribute a $V_{DD}$ supply voltage.

19. The computer program of claim 17 wherein said third power bus distributes a $V_{SS}$ supply voltage.

20. The computer program of claim 17 wherein said first cells comprise one or more first semiconductor devices.

21. The computer program of claim 20 wherein said first semiconductor devices are N channel field effect transistors, P channel field effect transistors, or both N channel field effect transistors and P channel field effect transistors.

22. The computer program of claim 17 wherein said second cells comprise one or more second semiconductor devices.

23. The computer program of claim 22 wherein said second semiconductor devices are N channel field effect transistors, P channel field effect transistors, or both N channel field effect transistors and P channel field effect transistors.

24. The computer program of claim 17 wherein said third power bus is split into two adjacent, parallel, and electrically interconnected power buses.

25. A layout structure for integrated circuit standard circuit cells; comprising:

a first power bus, wherein said first power bus is arranged in a straight line;

a second power bus, wherein said second power bus is arranged in a straight line parallel to said first power bus, and electrically connected to said first power bus;

a third power bus, wherein said third power bus is arranged in a straight line parallel to said first power bus and located between said first power bus and said second power bus;

a plurality of first cells arranged in a first row and located between said first power bus and said third power bus, wherein said first cells are coupled to said first power bus and said third power bus; and a plurality of second cells arranged in a second row and located between said second power bus and said third power bus, wherein said second cells are coupled to said first cells, said second power bus, and said third power bus, said third power bus split into two adjacent, parallel, and electrically interconnected power buses.

26. A method of laying out integrated circuit standard circuit cells; comprising:

forming a first power bus, wherein said first power bus is arranged in a straight line;

forming a second power bus, wherein said second power bus is arranged in a straight line parallel to said first power bus, and electrically connected to said first power bus;

forming a third power bus, wherein said third power bus is arranged in a straight line parallel to said first power bus and located between said first power bus and said second power bus;

forming a plurality of first cells arranged in a first row and located between said first power bus and said third power bus, wherein said first cells are coupled to said first power bus and said third power bus; and forming a plurality of second cells arranged in a second row and located between said second power bus and said third power bus, wherein said second cells are coupled to said first cells, said second power bus, and said third power bus, said third power bus split into two adjacent, parallel, and electrically interconnected power buses.

27. A computer program for laying out integrated circuit standard circuit cells; comprising the steps of:

forming a first power bus, wherein said first power bus is arranged in a straight line;

forming a second power bus, wherein said second power bus is arranged in a straight line parallel to said first power bus, and electrically connected to said first power bus;

forming a third power bus, wherein said third power bus is arranged in a straight line parallel to said first power bus and located between said first power bus and said second power bus;

forming a plurality of first cells arranged in a first row and located between said first power bus and said third power bus, wherein said first cells are coupled to said first power bus and said third power bus; and forming a plurality of second cells arranged in a second row and located between said second power bus and said third power bus, wherein said second cells are coupled to said first cells, said second power bus, and said third power bus, said third power bus split into two adjacent, parallel, and electrically interconnected power buses.

* * * * *